(12) United States Patent
Mantz et al.

(10) Patent No.: US 7,427,774 B1
(45) Date of Patent: Sep. 23, 2008

(54) TARGETS FOR MEASUREMENTS IN SEMICONDUCTOR DEVICES

(75) Inventors: Ulrich Mantz, Saxony (DE); Shoaib Hasan Zaidi, Poughkeepsie, NY (US); Christopher Gould, Quinton, VA (US)

(73) Assignees: Infineon Technologies AG, Munich (DE); Infineon Technologies Richmond, LP, Sandston, VA (US)

( * ) Notice: Subject to any disclaimer, the term of this patent is extended or adjusted under 35 U.S.C. 154(b) by 342 days.

(21) Appl. No.: 11/119,029

(22) Filed: Apr. 29, 2005

(51) Int. Cl.
*H01L 23/58* (2006.01)
(52) U.S. Cl. ............................ 257/48; 257/E21.521
(58) Field of Classification Search ............... 257/48
See application file for complete search history.

(56) References Cited

U.S. PATENT DOCUMENTS 6,822,260 B1 * 11/2004 Nariman et al. ............ 257/48

2005/0089775 A1 * 4/2005 Archie et al. ............... 430/30

OTHER PUBLICATIONS

Niu, X., "Specular Spectroscopic Scatterometry in DUV Lithography," Metrology, Inspection, and Process Control for Microlithography XIII, 1999, pp. 159-168, SPIE Proceedings, vol. 3677, Paper No. 3677-18, SPIE—The International Society for Optical Engineering, Bellingham, WA.

* cited by examiner

*Primary Examiner*—Wai-Sing Louie
(74) *Attorney, Agent, or Firm*—Slater & Matsil, L.L.P.

(57) ABSTRACT

Targets or test structures used for measurements in semiconductor devices having long lines exceeding design rule limitations are divided into segments. In one embodiment, the segments have periodicity in a direction parallel to the length of the lines. In another embodiment, the segments of test structures in adjacent lines do not have periodicity in a direction parallel to the length of the lines. The lack of periodicity is achieved by staggering segments of substantially equal lengths in adjacent lines, or by dividing the lines into segments having unequal lengths. The test structures may be formed in scribe line regions or die regions of a semiconductor wafer.

19 Claims, 4 Drawing Sheets

TARGETS FOR MEASUREMENTS IN SEMICONDUCTOR DEVICES

TECHNICAL FIELD

The present invention relates generally to semiconductor devices, and more particularly to targets used for measurements in semiconductor devices.

BACKGROUND

Semiconductor devices are manufactured by depositing many different types of material layers over a semiconductor workpiece or wafer, and patterning the various material layers using lithography. The material layers typically comprise thin films of conductive, semiconductive and insulating materials that are patterned to form integrated circuits using lithography.

Semiconductor lithography involves placing a patterned mask between a semiconductor workpiece, and using an energy source to expose portions of a resist deposited on the workpiece, transferring the mask pattern to the resist. The resist is then developed during which either the exposed or unexposed regions of the resist are removed. The removal of exposed or unexposed regions depends whether the resist is positive or negative tone. The resist is then used as a mask while regions of a material corresponding to areas opened during resist development on the workpiece are etched.

In many designs, the individual features of an integrated circuit, such as gate lines or signal lines, as examples, have extremely small dimensions and may have widths of about 0.2 to 0.4 µm or less, with their lengths being considerably greater, about 0.8 to 2.0 µm or greater, for example. These thin lines may be intended for connection to other layers of the integrated circuit by narrow vias filled with conductive material. It is important in semiconductor designs that each layer is aligned properly to adjacent material layers to ensure electrical connection, and that the dimensions of patterned features are being correctly printed on the various material layers. The size integrity of critical dimensions (CD) may be compromised because of various processing and/or optical effects, for example. In particular, the accuracy of forming and positioning conductive lines and vias of an integrated circuit becomes increasingly critical as dimensions decrease. Relatively minor errors in positioning such features can cause a via to miss a conductive line altogether, or to contact the line over a surface area that is insufficient to provide the necessary conductivity for a fully functional circuit.

Optical measurements are used in semiconductor technology to measure a variety of parameters of semiconductor devices. The measurements may be used for critical dimension measurement, line shortening measurements, and alignment and overlay measurements, as examples. Gratings are often used as a target for measurement in semiconductor lithography. The gratings typically comprise a line and space pattern. For example, a row of gratings is typically used in scatterometry to measure CD.

Scatterometry involves measuring order diffraction responses of a grating at multiple wavelengths, as described in a paper entitled "Specular Spectroscopic Scatterometry in DUV Lithography" by Xinhui Niu et al., Proc. SPIE 1999, Vol. 3677, pp. 159-168, which is incorporated herein by reference. As described in the paper, scatterometry is a library-based methodology for CD profile extraction. Measurements of the gratings are compared to those stored in a library, e.g., in a look-up table, and any variations from the library data indicate the amount that the CD is too large or too small, for example.

However, many optical measurements require targets having dimensions that exceed the design rule limitations. For example, lithography of extremely long and thin patterns may be limited by the wavelength and photoresist used to pattern the target. One requirement, particularly in scatterometry, is to manufacture targets comprising line and space pairs that are sufficiently large for measurement by an optical measurement tool.

What are needed in the art are improved targets or test structures for optical measurements of semiconductor devices, wherein the targets have features that have dimensions within the design rule limitations of the semiconductor devices.

SUMMARY OF THE INVENTION

These and other problems are generally solved or circumvented, and technical advantages are generally achieved, by preferred embodiments of the present invention, which provide improved methods of forming targets for optical measurements and structures thereof. Long lines of gratings of targets or test structures are divided into segments, wherein each segment of a line comprises a dimension that is within the design rule limitations of the semiconductor device. In some embodiments, the segments of lines in adjacent lines either comprise substantially the same length and are staggered, or comprise different lengths, to avoid creating periodicity in a direction parallel with the length of the lines. In other embodiments, the segments of lines have periodicity in the direction parallel with the length of the lines.

In accordance with a preferred embodiment of the present invention, a test structure for a semiconductor device includes at least one grating, the grating comprising a plurality of parallel lines, each of the plurality of parallel lines having a first length, wherein each line is divided into a plurality of discrete segments along the first length of the line.

In accordance with another preferred embodiment of the present invention, a method of designing a test structure for a semiconductor device includes designing a test structure comprising at least one grating, the grating comprising a plurality of parallel lines, each of the plurality of parallel lines having a first length. Each line of the grating is divided into a plurality of discrete segments along the first length of the line.

Advantages of embodiments of the present invention include providing improved methods of forming targets for optical measurements and structures thereof. In some embodiments, because there is a lack of periodicity in one direction of the test structures, accurate optical measurements with less complications using scatterometry and other measurement techniques may be performed.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in patterns for targets used in optical measurements of semiconductor devices. The invention may also be applied, however, to other aspects of semiconductor devices, such as targets used for other types of measurements and patterned features of material layers of semiconductor devices, as examples.

Targets or test structures of optical measurements for semiconductor devices typically comprise grating structures. In some semiconductor designs, the test structures may comprise sacrificial structures that are formed on a scribe line region. When the die of a wafer are singulated, the test structures are destroyed and discarded, for example. In other semiconductor designs, the test structures are located in die regions of a wafer, and the test structures are discarded after the semiconductor devices are manufactured.

Scatterometry typically requires the use of periodic structures in one direction, so that the periodic structures have scattering and diffraction effects.

Some test structures require high aspect ratio features, e.g., the gratings include parallel long lines that have a large height (e.g., in a dimension from a substrate to the top surface). When patterned, the long lines have a tendency to stick together and are mechanically unstable. The long lines present problems in etch processes, due to undercutting of the high aspect ratio features. Furthermore, the long lines exhibit loading effects, wherein more material is etched in the testing structure than in the array or the active chip area. The aspect ratios can be as high as 1:50 or greater, for example. A feature may be about 6 to 7 µm deep into a substrate or material layer, and may have a length of about 100 nm, as examples, although the test features may alternatively comprise other dimensions.

To alleviate the etching problems and loading effects of the test structures, design rules are developed, which involve determining a maximum feature size that can be optimally etched for a particular semiconductor device. For example, a design rule may require that a feature may not be etched that is longer than about 10 µm×about 50 nm, as an example, although design rules may comprise other dimensions in other applications, typically depending on the minimum feature size of the integrated circuit or chip.

Figure 1:
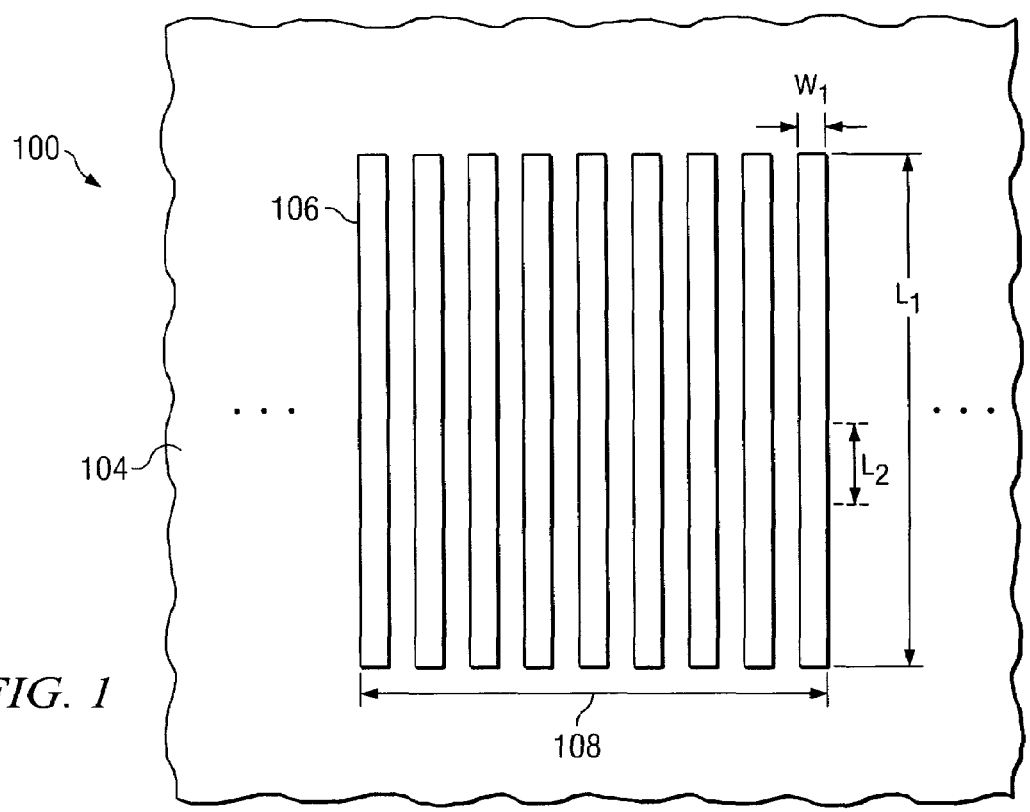
FIG. 1 shows a top view of a less-preferred embodiment of the present invention, wherein a target for optical measurements comprises a line and space pattern, wherein each line comprises a length that exceeds the design rule limitations.

FIG. 1 shows a top view of a less-preferred embodiment of the present invention, wherein a semiconductor device 100 includes a target (also referred to herein as a test structure) for optical measurements comprising a line and space pattern. The semiconductor device 100 may include a workpiece or substrate with a layer of insulating material 104 formed thereon. The target may comprise a plurality of lines 106 formed a conductive or semiconductive material, for example. Each line 106 of the target comprises a length $L_1$ that exceeds the design rule limitations, e.g., length $L_2$, in this less-preferred embodiment. The length $L_1$ of the lines 106 of the test structure may comprise about 100 µm, for example, although length $L_1$ may alternatively comprise other dimensions, for example. The test structure comprises a plurality of long lines 106 separated by spaces, wherein the width $W_1$ of the lines 106 may comprise a minimum feature size of the semiconductor device 100, such as about 100 nm, although alternatively, the width $W_1$ of the lines 106 may comprise other dimensions, for example. The distance between adjacent and parallel lines 106 may also comprise a minimum feature size of the semiconductor device 100, for example. The target pattern comprises a periodicity in a direction 108 perpendicular to the length of the lines 106, as shown.

A disadvantage of the test structure shown in FIG. 1 is that because the line 106 comprise a length $L_1$ that exceeds the design rule limitations, e.g., length $L_2$, attempting to pattern the long lines 106 using lithography would result in collapse of some of the lines 106, and thus would render the lines 106 of the test structure unusable as a test structure. The design rule (or ground rule) $L_2$ may comprise a maximum dimension of about 2 to 50 µm, for example, although alternatively, the design rule $L_2$ may alternatively comprise other dimensions, typically depending on the minimum feature size of the semiconductor device 100, for example.

The design rules comprise rules for designers that design a layer or set of layers of a semiconductor device. The design rules define a minimum and maximum features size that may be patterned with respect to a particular layer or process, for example. The ground rules (also referred to herein as 'design rules') for a semiconductor device are a function of a variety of parameters, such as the thickness of the material layers, the type of materials used, and the processes used, for example. If the material layer is relatively deep, then the design rules are typically shorter, and if the material layer is relatively thin, then the maximum feature size is typically longer, for example.

Figure 2:
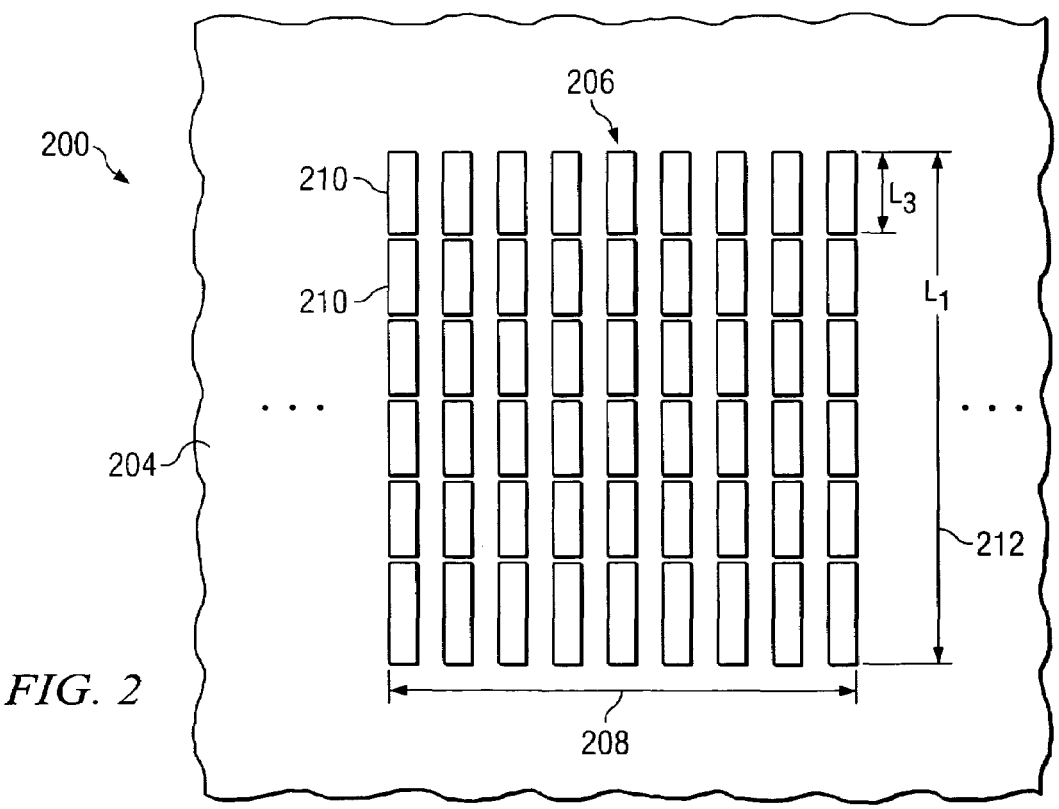
FIG. 2 shows a top view of one embodiment of the present invention, wherein each line of the target shown in FIG. 1 is divided into a plurality of equal segments, wherein adjacent lines have segments located in the same position, creating a periodicity in the direction parallel to the length of a line.

One approach to forming a test structure that has features that are within the design rule limitations is to segment the lines, as shown in a top view in FIG. 2, in accordance with an embodiment of the present invention. Like numerals are used in FIG. 2 as were used in FIG. 1, and to avoid repetition, each element in FIG. 2 is not described in detail.

FIG. 2 illustrates an embodiment of the present invention, wherein each line 206 of the target (e.g., lines 106 shown in FIG. 1) is divided into a plurality of segments 210 having substantially an equal length $L_3$. Length $L_3$ is preferably less than or equal to the design rule limitations, e.g., length $L_2$ shown in FIG. 1, in this embodiment. The length $L_3$ of the segments 210 may comprise a dimension of about 50 µm, as an example, although the segment length $L_3$ may alternatively comprise other dimensions.

However, this test structure has a periodicity in the horizontal direction 208, e.g., in a direction perpendicular to the length $L_1$ of the lines 206, and also has a periodicity in direction 212 parallel to the length $L_1$ of the lines 206. The periodicity in direction 212 is created by the ends of the segments 210 in adjacent lines 206 being aligned. The periodicity in direction 212 makes the test structure challenging as a target in some measurement techniques, such as scatterometry. Because the gratings of the test structure have periodicity in two directions 208 and 212, the calculations required to determine CD, for example, are more complicated. It is desirable to have periodicity on only one direction in a test pattern for scattterometry, for this reason, for example. Thus, it would be desirable to eliminate the second periodicity in the test structure, e.g., in the direction 212 parallel to the length of the lines 206.

Figure 3:
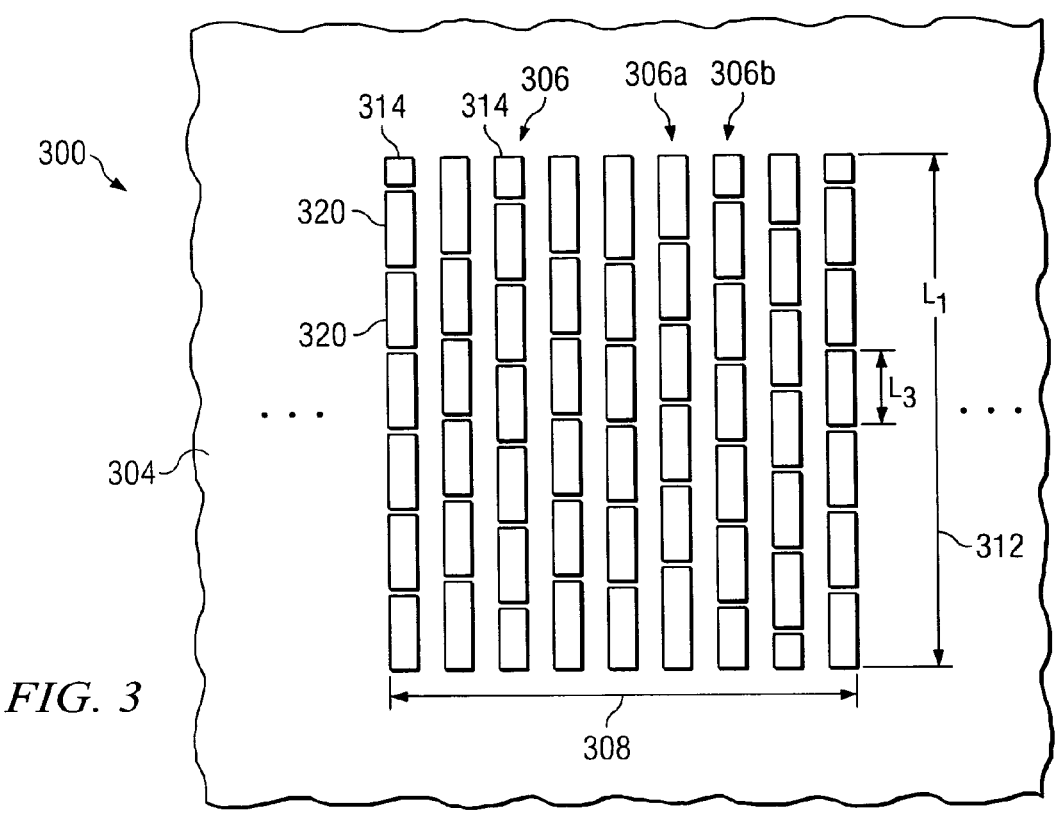
FIG. 3 shows a top view of a preferred embodiment of the present invention, wherein a target for optical measurement on a semiconductor device comprises a line and space pattern, wherein each line is divided into segments having substantially equal lengths, and wherein segments in adjacent lines are staggered, avoiding periodicity in the direction parallel to the length of the lines.

FIG. 3 shows a top view of a preferred embodiment of the present invention, wherein a target for optical measurement on a semiconductor device 300 comprises a line and space pattern, wherein each line 306 is divided into segments 320, and wherein the segments 320 in adjacent lines 306 (e.g., as illustrated by referring to two adjacent lines 306a and 306b) are staggered, avoiding periodicity in the direction 312 parallel to the length $L_1$ of the lines 306. Again, like numerals are used for the elements in FIG. 3 as were used in FIGS. 1 and 2, and each element is not described again in detail herein, to avoid repetition.

In particular, the ends of the segments 320 in adjacent lines are staggered in this embodiment, for example. The staggering of the ends of the segments 320 in adjacent lines 306 eliminates the periodicity in direction 312 parallel to the length $L_1$ of the plurality of parallel lines 306, advantageously allowing the novel test structure to be used for optical measurements using a variety of optical measurement techniques, including scatterometry, for example.

In the embodiment shown in FIG. 3, preferably, the majority of the segments 320 of the lines 306 comprise discrete segments that comprise substantially the same dimension. However, segments 320 at the ends 314 of the lines 306 preferably comprise a smaller dimension than segments 320 in a central region of the lines. The shorter segments 320 at the ends 314 are a result of the staggering of the ends of the segments 320, for example, because the lines 306 comprise substantially the same dimension.

Length $L_3$ is preferably less than or equal to the design rule limitations, e.g., length $L_2$ shown in FIG. 1, in this embodiment. The length $L_3$ of the segments 320 may comprise a dimension of about 50 µm or less, as an example, although the segment length $L_3$ may alternatively comprise other dimensions.

Figure 4:
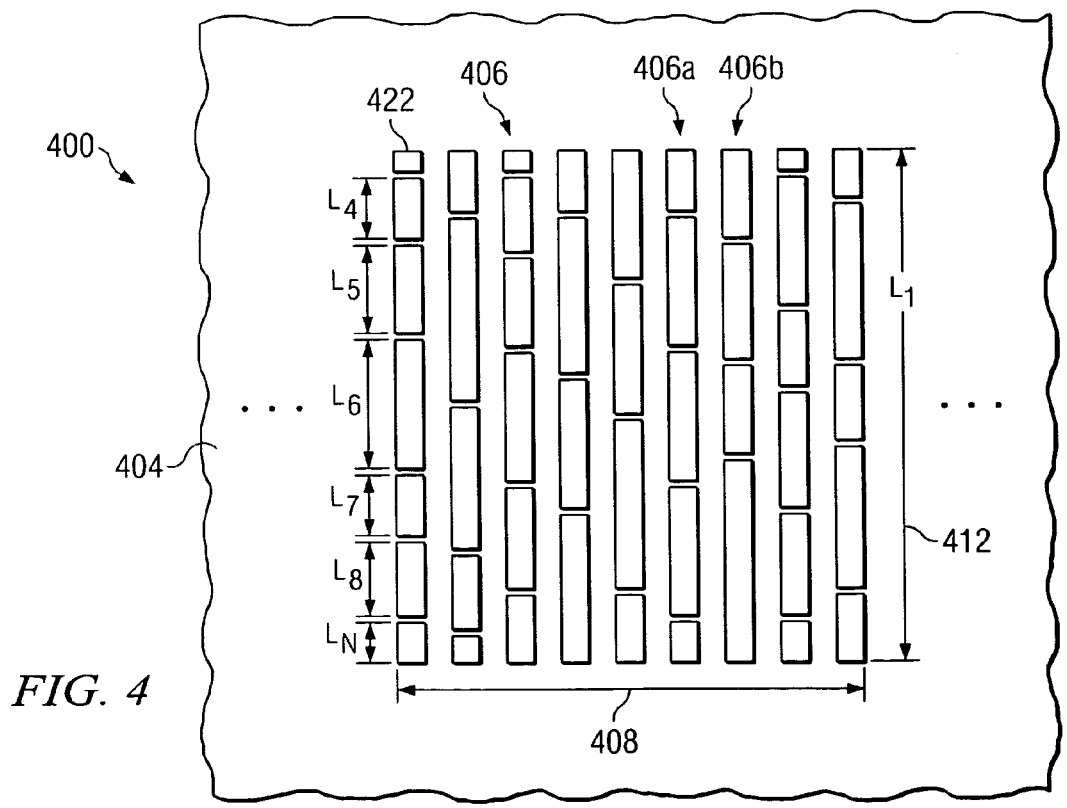
FIG. 4 shows another preferred embodiment of the present invention, wherein a target for optical measurements on a semiconductor device comprises a line and space pattern, wherein each line is divided into a plurality of segments having unequal lengths, avoiding periodicity in the direction parallel to the length of the lines.
Figure 5:
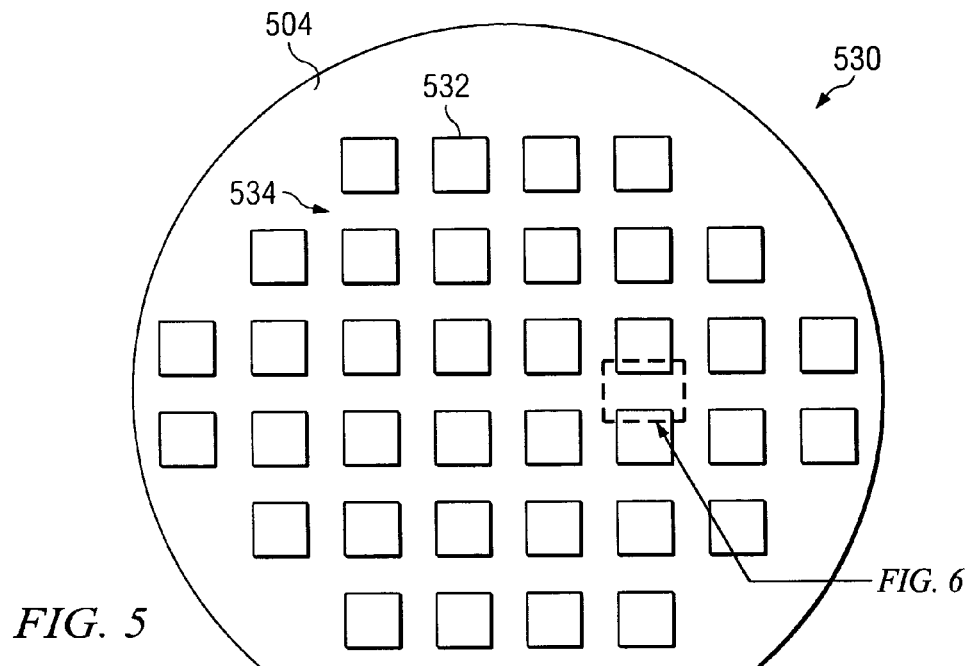
FIG. 5 shows a top view of a semiconductor wafer, illustrating that the targets described herein may be located at the scribe line regions between the individual die.
Figure 6:
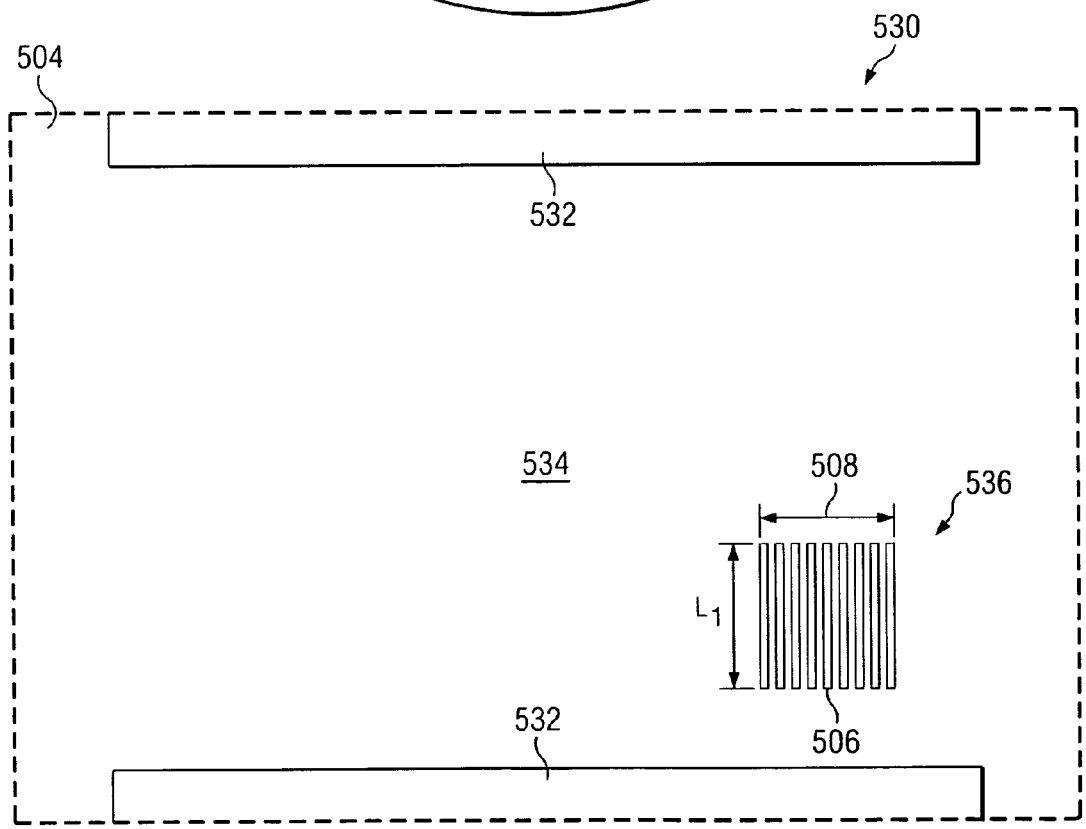
FIG. 6 shows a more detailed view of a target formed in a scribe line region in accordance with one embodiment of the invention.

Like numerals are used for the elements in FIGS. 4 through 6 as were used in FIGS. 1 through 3, and each element is not described again in detail herein, to avoid repetition.

FIG. 4 shows another preferred embodiment of the present invention, wherein a target for optical measurements on a semiconductor device comprises a line and space pattern, wherein each line 406 is divided into a plurality of segments 422 having unequal lengths $L_4, L_5, L_6, L_7, L_8, L_8, \ldots L_N$. The ends of the varying length segments 422 are staggered or unaligned in adjacent lines 406 (e.g., as illustrated in adjacent lines 406a and 406b), avoiding periodicity in the direction 412 parallel to the length $L_1$ of the lines 406.

In this embodiment, each length $L_4, L_5, L_6, L_7, L_8, L_8, \ldots L_N$ of a segment 422 in a line 406 is preferably less than or equal to the design rule limitations, e.g., length $L_2$ shown in FIG. 1. The length $L_4, L_5, L_6, L_7, L_8, L_8, \ldots L_N$ of the segments 422 may comprise a dimension of about 50 µm or less, as an example, although the segment lengths $L_4, L_5, L_6, L_7, L_8, L_8, \ldots L_N$ may alternatively comprise other dimensions.

In particular, in one embodiment, the plurality of parallel lines 406 preferably comprise a first line 406a and at least one second line 406b parallel to the first line 406a, wherein the first line 406a comprises a first segment 422 and at least one second segment 422, the first segment 422 and second segment 422 comprising different lengths. The at least one second line 406b comprises a third segment 422 and a fourth segment 422, the third segment 422 and the fourth segment 422 comprising different lengths, wherein the first segment 422 of the first line 406a is proximate the third segment 422 of the at least one second line 406b. A first end of the first segment 422 is preferably not aligned with a first end of the third segment 422, and a second end of the first segment 422 is not aligned with a second end of the second segment 422. The second segment 422 of the first line 406a is preferably proximate the fourth segment 422 of the at least one second line 406b, wherein a first end of the second segment 422 is not aligned with a first end of the fourth segment 422, and wherein a second end of the second segment 422 is not aligned with a second end of the fourth segment 422.

FIG. 5 shows a top view of a semiconductor wafer 530, illustrating that the targets described herein may be located at the scribe line regions 534 between the individual die 532. In this embodiment, the targets or test structures are sacrificial structures that are destroyed and/or discarded after the die are singulated. In another embodiment, the test structures may be formed in a die 532 region and may be discarded after singulation, for example.

Figure 7:
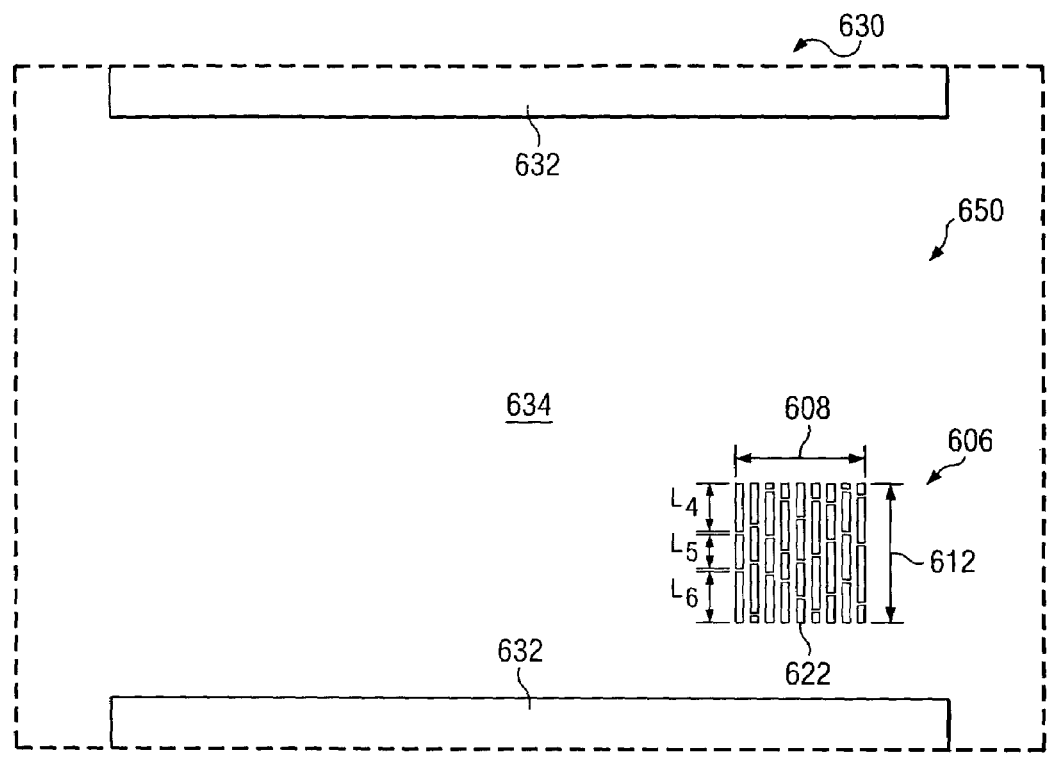
FIG. 7 shows a more detailed view of a target formed in a scribe line region according to a preferred embodiment of the present invention, wherein the lines in the line and space pattern are divided into segments that lack a periodicity in a direction parallel to the length of the lines.

FIG. 6 shows a more detailed view of FIG. 7, showing a target 536 formed in a scribe line region 534 in one embodiment of the present invention, wherein the lines 506 of the target comprise a length $L_1$ and are not segmented (thus violating the design rules) and exhibit periodicity in a direction 508 perpendicular to the length $L_1$ of the lines 506.

Figure 8:
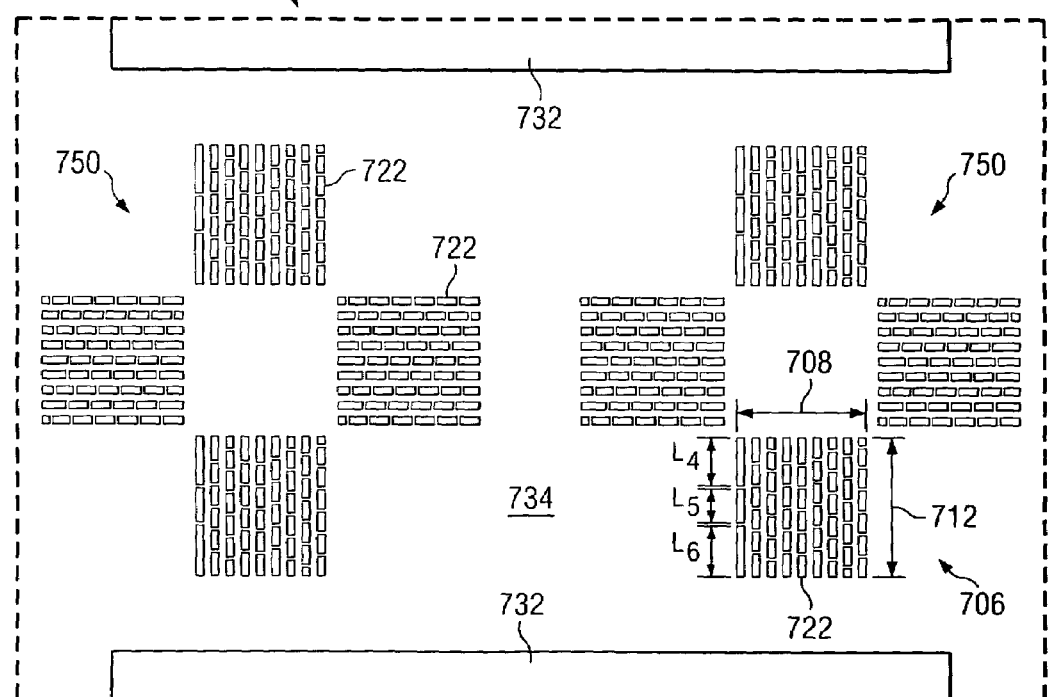
FIG. 8 shows an embodiment of the present invention, wherein the targets comprise a box-in-box structure that may be used as alignment and/or overlay marks, as examples.

Like numerals are used for the elements in FIGS. 7 and 8 as were used in FIG. 6, and each element is not described again in detail herein, to avoid repetition.

FIG. 7 shows a more detailed view of FIG. 5, illustrating a target 650 or test structure formed in a scribe line region 634 according to a preferred embodiment of the present invention, wherein the lines 606 in the line and space pattern are divided into segments 622 that lack a periodicity in a direction 612 coincident (or parallel) with the length $L_1$ of the lines 606. The lines 606 are preferably arranged in a single horizontal row, as shown, and may be used for scatterometry measurements of CD, for example. Alternatively, the lines 606 may be arranged in other patterns, for example. The test structures may be formed in a scribe line 634 as shown in FIG. 7, or in a die region, such as in the location of a die 632, as examples.

Embodiments of the present invention may be implemented in other test structures comprising gratings. As an example, two rows and two columns of gratings arranged in a box that may be used as alignment and overlay measurement marks, as examples, are illustrated in FIG. 8. The grating patterns are often referred to in the art as a box-in-box structure, for example, with a first box being defined by the exterior ends of the rows and columns of the gratings, and a second box being defined by the interior ends of the rows and columns of the gratings. These box-in-box structures may be used to check the positioning and registration between two patterned material layers, for example.

In accordance with this embodiment of the present invention, a test structure 750 includes a plurality of gratings 706, wherein each grating is divided into a plurality of segments 722 comprising a variety of lengths to avoid a periodicity in a direction 712 parallel with the length of the lines or gratings 706, for example.

Advantages of embodiments of the present invention include providing improved methods of forming targets for optical measurements and structures thereof. In some embodiments, because there is a lack of periodicity in one direction of the test structures, more accurate optical measurements using scatterometry and other measurement techniques may be performed. The test structures may be formed in scribe line regions or die regions of a semiconductor device. Embodiments of the invention are useful in applications having test structures comprised of gratings, such as those used for scatterometry, alignment measurement, and overlay measurement, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test structure for a semiconductor device, comprising:
at least one grating, the grating comprising a plurality of parallel lines, each of the plurality of parallel lines having a first length, wherein each line is divided into a plurality of discrete segments along the first length of the line,
wherein the segments of the lines comprise varying dimensions,
wherein segments in adjacent lines are staggered in the direction parallel to the first length of the plurality of parallel lines, and
wherein the plurality of parallel lines comprises a first line and at least one second line parallel to the first line, wherein the first line comprises a first segment and at least one second segment, the first segment and second segment comprising different lengths, wherein the at least one second line comprises a third segment and a fourth segment, the third segment and the fourth segment comprising different lengths, wherein the first segment of the first line is proximate the third segment of the at least one second line, wherein a first end of the first segment is not aligned with a first end of the third segment, wherein a second end of the first segment is not aligned with a second end of the second segment, wherein the second segment of the first line is proximate the fourth segment of the at least one second line, wherein a first end of the second segment is not aligned with a first end of the fourth segment, and wherein a second end of the second segment is not aligned with a second end of the fourth segment.

2. The test structure according to claim 1, wherein each segment comprises a length less than a design rule limitation dimension for the semiconductor device.

3. The test structure according to claim 1, wherein a majority of the segments of the lines comprise substantially the same dimension.

4. The test structure according to claim 3, wherein segments at the ends of the lines comprise a smaller dimension than segments in a central region of the lines.

5. The test structure according to claim 1, wherein segments in adjacent lines are staggered in the direction parallel to the first length of the plurality of parallel lines.

6. The test structure according to claim 1, wherein the gratings are arranged in two horizontal rows having a first end and a second end, and two vertical columns disposed at the first end and the second end of the two horizontal rows.

7. The test structure according to claim 1, wherein the test structure is located in a scribe line region of a semiconductor wafer or in a die region of a semiconductor wafer.

8. The test structure according to claim 1, wherein the test structure comprises a target for measurements of scatterometry, alignment, or overlay.

9. A method of designing a test structure for a semiconductor device, the method comprising:
designing a test structure comprising at least one grating, the grating comprising a plurality of parallel lines, each of the plurality of parallel lines having a first length; and
dividing each line of the grating into a plurality of discrete segments along the first length of the line,
wherein dividing each line of the grating into the plurality of discrete segments comprises dividing each line such that segments in adjacent parallel lines lack periodicity in a direction parallel to the first length of the plurality of parallel lines, wherein dividing each line of the grating into a plurality of discrete segments comprises dividing each line such that the segments of the lines comprise varying dimensions, and wherein the plurality of parallel lines comprise a first line and at least one second line parallel to the first line, wherein dividing each line of the grating into a plurality of discrete segments comprises dividing each line such that the first line comprises a first segment and at least one second segment, the first segment and second segment comprising different lengths, such that the at least one second line comprises a third segment and a fourth segment, the third segment and the fourth segment comprising different lengths, wherein dividing each line of the grating into a plurality of discrete segments further comprises dividing each line such that the first segment of the first line is proximate the third segment of the at least one second line, such that a first end of the first segment is not aligned with a first end of the third segment, such that a second end of the first segment is not aligned with a second end of the second segment, such that the second segment of the first line is proximate the fourth segment of the at least one second line, such that a first end of the second segment is not aligned with a first end of the fourth segment, and such that a second end of the second segment is not aligned with a second end of the fourth segments.

10. The method according to claim 9, wherein dividing each line of the grating into a plurality of discrete segments comprises dividing each line such that each segment comprises a length less than a design rule limitation dimension for the semiconductor device.

11. The method according to claim 9, wherein dividing each line of the grating into a plurality of discrete segments comprises dividing each line such that each segment comprises a length less than a design rule limitation dimension for the semiconductor device.

12. The method according to claim 9, wherein dividing each line of the grating into a plurality of discrete segments comprises dividing each line such that a majority of the segments of the lines comprise substantially the same dimension.

13. The method according to claim 12, wherein dividing each line of the grating into a plurality of discrete segments comprises dividing each line such that segments at the ends of the lines comprise a smaller dimension than segments in a central region of the lines.

14. The method according to claim 9, wherein dividing each line of the grating into a plurality of discrete segments comprises dividing each line such that segments in adjacent lines are staggered in the direction parallel to the first length of the plurality of parallel lines.

15. The method according to claim 9, wherein dividing each line of the grating into a plurality of discrete comprises dividing each line such that segments in adjacent lines are staggered in the direction parallel to the first length of the plurality of parallel lines.

16. The method according to claim 9, wherein designing the test structure comprises designing a test structure comprising two horizontal rows of gratings each having a first end and a second end, and two vertical columns of gratings disposed at the first end and the second end of the two horizontal rows of gratings.

17. The method according to claim 9, wherein designing the test structure comprises designing a test structure located in a scribe line region of a semiconductor wafer or in a die region of a semiconductor wafer.

18. The test structure according to claim 1, wherein segments in adjacent parallel lines lack periodicity in a direction parallel to the first length of the plurality of parallel lines.

19. The test structure according to claim 18, wherein each segment comprises a length less than a design rule limitation dimension for the semiconductor device.

\* \* \* \* \*